(12) United States Patent
Layman et al.

(10) Patent No.: US 6,906,962 B2
(45) Date of Patent: Jun. 14, 2005

(54) METHOD FOR DEFINING THE INITIAL STATE OF STATIC RANDOM ACCESS MEMORY

(75) Inventors: Paul Arthur Layman, Orlando, FL (US); Samir Chaudhry, Weston, FL (US); James Gary Norman, Orlando, FL (US); J. Ross Thomson, Clermont, FL (US)

(73) Assignee: Agere Systems Inc., Allentown, PA (US)

( * ) Notice: Subject to any disclaimer, the term of this patent is extended or adjusted under 35 U.S.C. 154(b) by 59 days.

(21) Appl. No.: 10/262,631

(22) Filed: Sep. 30, 2002

(65) Prior Publication Data

US 2004/0062083 A1 Apr. 1, 2004

(51) Int. Cl.[7] .............................................. G11C 16/04
(52) U.S. Cl. .................. 365/189.01; 365/154; 365/227; 257/392; 257/393
(58) Field of Search ............................ 365/154, 189.01, 365/227; 257/392, 393

(56) References Cited

U.S. PATENT DOCUMENTS

| 5,285,069 | A | * | 2/1994 | Kaibara et al. | 257/392 |
| 5,325,325 | A | | 6/1994 | Azuma | |
| 5,477,176 | A | | 12/1995 | Chang et al. | |
| 5,703,392 | A | * | 12/1997 | Guo | 257/392 |
| 5,717,637 | A | | 2/1998 | Hotta | |
| 6,117,721 | A | * | 9/2000 | Dennison et al. | 438/238 |
| 6,341,093 | B1 | * | 1/2002 | Eckert et al. | 365/201 |

FOREIGN PATENT DOCUMENTS

EP        0 530 376 A1     3/1993

* cited by examiner

*Primary Examiner*—Richard Elms
*Assistant Examiner*—Toan Le

(57) ABSTRACT

A method for predetermining the initial state of the memory cells of a static random access memory such that when the memory is powered up the predetermined initial states are attained. The initial states can be predetermined by modifying one or more physical or operational parameters of the MOSFETS comprising the memory cells.

33 Claims, 4 Drawing Sheets

METHOD FOR DEFINING THE INITIAL STATE OF STATIC RANDOM ACCESS MEMORY

FIELD OF THE INVENTION

The present invention is directed generally to static random access memories, and more particularly to a method and apparatus for defining the initial state of the static random access memory cells.

BACKGROUND OF THE INVENTION

Random access memory arrays, including static random access memories (SRAMs), are well known in the art. Such arrays are comprised of a plurality of memory cells, each cell storing a single bit of information in the form of a binary 1 or a binary 0. Each cell is essentially a flip-flop positioned at the intersection of an array of row and column address lines. Specifically, each cell is positioned at the intersection of a word line, for selecting a row of the memory array, and a set of complimentary bit lines (i.e., a bit line and an inverse bit line) for selecting a column of the array. These memories provide random access in the sense that each cell can be individually addressed for read and write operations as determined by an address provided to a row and column address decoder, that in turn selects the intended cell at the intersection of the row and column address lines. Generally, the row or wordline is selected first, enabling all the cells on the selected row. The bitline and the inverse bitline select the individual column from within the selected cell row, for reading a bit from or writing a bit to the selected cell over the bitline and the inverse bitline.

SRAMs are often used to store program memory in electronic devices, such as computers and other devices that operate under control of a processor executing program commands. Since SRAMs are volatile memory devices, the program instructions and data items required during the start-up or boot-up operational phase are stored in non-volatile memory when no external power is supplied to the device. At start-up, the instructions and data are downloaded to the SRAM. During device operation the processor accesses instructions and data stored in the SRAM and writes resultant data back to the SRAM, as the SRAM provides faster access times than nonvolatile memory. However, initial operation of the device is delayed while program instructions and start-up data are loaded from the non-volatile memory into the SRAM. Included among the non-volatile memory types for storing executable programs and start-up data are: read only memories (ROM's), programmable read only memories (PROM's), erasable programmable read only memories (EPROM's), and optical media such as disk drives and magnetic media such as floppy disk drives.

BRIEF SUMMARY OF THE INVENTION

A memory array comprises a plurality of cross-connected CMOS inverter pairs, each one forming a memory cell. The CMOS inverters each comprise a plurality of MOSFET devices (metal-oxide semiconductor field-effect transistors). To predetermine the initial state of the array or individual memory cells in the array, a physical parameter affecting the start-up or initial state of one or more of the MOSFETs of a memory cell is identified. For example, the threshold voltage is such a parameter. During or following fabrication of the MOSFETs, the physical parameter is controlled so that the memory cell powers-up to the predetermined initial state. In another embodiment this process can be extended to all memory cells of the memory array to provide a predetermined initial state for the memory array.

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

DETAILED DESCRIPTION OF THE INVENTION

Figure 1:
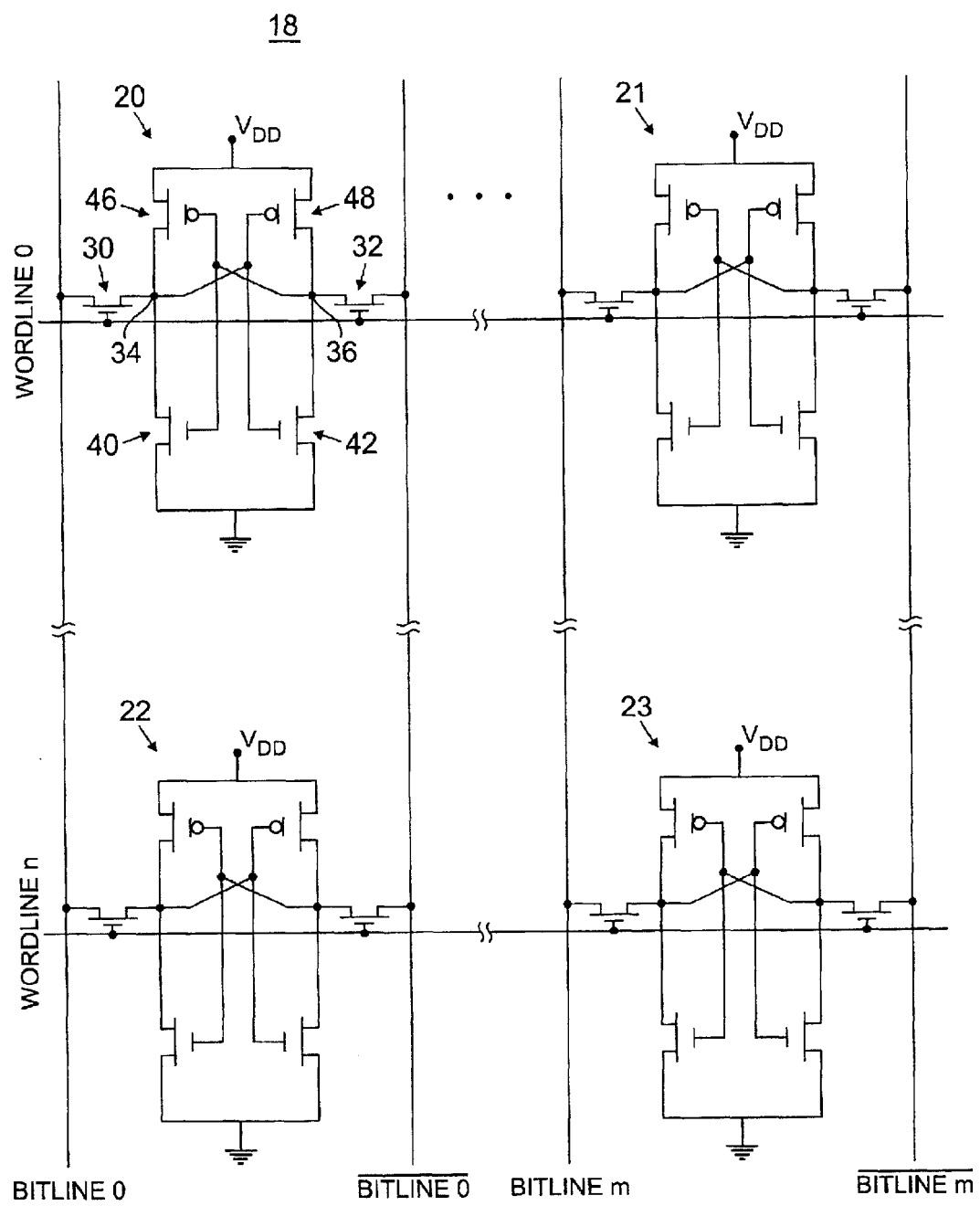
FIG. 1 is a schematic diagram of a typical static random access memory array.

Before describing in detail the particular method for defining the initial state of an SRAM according to the teachings of the present invention, it should be observed that the present invention resides primarily in a novel combination of hardware elements and method steps. Accordingly, the elements and steps have been represented by conventional elements in the drawings, showing only those specific details that are pertinent to the present invention, so as not to obscure the disclosure with structural details that will be readily apparent to those skilled in the art having the benefit of the description herein.

FIG. 1 is an exemplary schematic of four static random access (SRAM) cells 20, 21, 22 and 23 constituting a SRAM memory array 18 to which the teachings of the present invention can be applied. The SRAM memory array 18 has n wordlines (wordline 0 to wordline n) and m bitlines (bitline 0 to bitline m). Each of the memory cells 20, 21, 22 and 23 comprises six metal-oxide field-effect transistors (MOSFETS) arranged as two cross-coupled complementary MOSFETS (i.e., CMOS) inverters. Each of the cells 20, 21, 22 and 23 includes the same basic components and functions in the same manner. Thus only the cell 20 is described in detail below.

The cell 20 includes NMOS switching transistors 30 and 32 having their gate terminals connected to a wordline 0. Source and drain terminals of the transistor 30 are connected between a bitline 0 and a node 34. Source and drain terminals of the transistor 32 are connected between an inverse bitline 0 and a node 36. A first source/drain terminal of NMOS (on n-channel MOSFETs) transistors 40 and 42 is connected to ground. A first source/drain terminal of PMOS (or p-channel MOSFETs) transistors 46 and 48 is connected to a supply voltage, $V_{DD}$. A second source/drain terminal of the transistors 40 and 42 is connected to a second source/drain terminal of the transistors 46 and 48 at the nodes 34 and 36, respectively. The node 34 is further connected to a gate terminal of each transistor 42 and 48. The node 36 is further connected to a gate terminal of each of the transistors 40 and 46.

In operation, the cross-coupling of the two CMOS inverters (where the first inverter comprises the transistors 40 and 46 with the node 34 operating as the output terminal, and the second inverter comprises the transistors 42 and 48 with the node 36 operating as the output terminal) creates a bistable device. If the output of the first inverter is high (that is, the transistor 46 is on, the transistor 40 is off and the voltage at the node 34 is high), that high voltage at the node 34 is provided as an input to the gate terminals of the transistors 42 and 48 that comprise the second inverter. The high voltage drives the second inverter low (that is, the transistor 48 is off, the transistor 42 is on and the voltage on the node 36 is low or at ground potential).

When the node 34 is high (i.e., the first inverter is high) the state of the cell 20 can be considered a "1" state. If the transistors 40, 42, 46 and 48 are in an opposite state to that described above, the first inverter output is low and the second inverter output is high. This state can be considered the "0" state for the cell 20. In the "0" state the node 34 is low and the node 36 is high.

To write a bit to the cell 20, the wordline 0 is selected, turning on the transistors 30 and 32. The bitline 0 and the inverse bitline 0 are charged to opposite states by a writer-driver, not shown, to store the bit on the bitline 0 to the memory cell 20. If a "1" on the bitline 0 is to be stored, the transistor 48 goes to an off state and the cross coupling drives the transistor 46 on. Thus the voltage at the node 34 goes high and a "1" is stored in the cell 20. The inverse bitline 0 is low as the node 36 is effectively grounded when the transistor 48 is off.

Alternatively, a "0" is stored by placing a low voltage on the bitline 0 and a high voltage on the inverse bitline 0. These voltages drive the transistor 48 into conduction and the transistor 46 goes off, driving the node 34 to ground and the node 36 high.

The bit stored in the memory cell 20 is read by selecting the wordline 0 and determining the difference between the voltage on the bitline 0 and the inverse bitline 0. A sense amplifier (not shown in FIG. 2) measures the voltage differential and provides an output bit representative of the stored bit.

During the design and fabrication processes, it is conventionally the intent to match the operational parameters of the two CMOS inverters comprising an SRAM cell, by matching their constituent MOSFETS. Thus quality fabrication process control seeks to match the two p-channel MOSFETs 46 and 48, and the two n-channel MOSFETs 40 and 42.

According to the teachings of the present invention, one or more process steps are employed to create mismatches and corresponding non-identical device characteristics in transistors comprising a memory cell, such as the memory cell 20. In particular, in one embodiment it is desired to create devices with different threshold voltages. As a result, one of the CMOS inverters comprising the memory cell 20 turns on before the other and thus the memory cell 20 assumes a predictable initial power-on (or power-up) state.

In a second embodiment it is desired to create devices with different drive currents. As a result, even though both MOSFETs 46 and 48 have the same threshold voltage and thus turn on at the same time, one has a higher drive current and thus the memory cell 20 assumes a predictable initial power-on state. In a third embodiment it is desired to create devices with both different threshold voltages and drive currents. Again this will cause memory cell 20 to assume a predictable power-on state.

For example, if the two p-channel MOSFETS 46 and 48 are not precisely matched, such that one of the two MOSFETs 46 and 48 exhibits a lower threshold voltage than the other, the MOSFET with the lower threshold voltage turns on first when power is first applied to the memory array 18. Thus if the MOSFET 46 turns on before the MOSFET 48 the voltage at the node 34 is high and the initial state of the memory cell 20 is a "1." Conversely, if the MOSFET 48 has a lower threshold voltage, the initial state of the memory cell 20 is a "0."

Exemplary process mismatches comprise a slight geometrical offset during an etch process step for forming the MOSFETs 46 and 48 such that one exhibits a shorter channel length than the other. This geometrical offset can be produced, for example, by slight modification of the one or more of the lithographic masks used to create the MOSFETs 46 and 48. The geometrical offset causes one of the MOSFETS to have a larger drive current than the other, and thus the preferred one of the CMOS inverters turns on before the other. Thus the power-up state of the memory cell 20 is predetermined and predictable.

Another exemplary process mismatch comprises an implant adjust in one of the MOSFET channel regions. Since precise quantities of an impurity can be implanted, the process allows control over the threshold voltage. For example, if boron (a p-type material) is implanted through the gate oxide of a p-channel MOSFET, such that the peak implant occurs immediately below the surface of the channel region, the negatively charged boron acceptors reduce the effects of the positive depletion charge in the channel. Recognizing that the threshold voltage of a p-channel MOSFET is a negative value, the boron acceptors cause the threshold voltage to be less negative. Thus an implant adjustment performed on one of the two p-channel MOSFETs 46 and 48 causes the adjusted MOSFET to turn on before the other. Careful selection of the implant dose can set the initial state of the cells of the SRAM 18 without affecting normal operation of the SRAM 18.

Among the many factors affecting the threshold voltage are the doping levels of the source and drain regions, the oxide capacitance, the various oxide interface trapped charges and geometrical offsets between adjacent layers. Any one or more of these parameters can be varied during the fabrication process to control the power on state of the memory cell 20.

Additionally, one of the two n-channel MOSFETS 40 and 42 (having a threshold voltage that is a positive number) can undergo an impurity adjustment by the implantation of an n-type dopant to lower the threshold voltage thereof or an adjustment in the channel length to affect the drive current.

Since the power-on state of each memory cell of the SRAM is controllable, an executable program, which according to the prior art is stored in a non-volatile memory, can now be stored in the SRAM 18 such that the executable program is immediately available in the SRAM 18 after the device has been powered up. With the program code stored in the SRAM 18, there is no need for a separate non-volatile memory device and the initialization time expended in transferring the program code from the non-volatile memory to the SRAM 18 is avoided. Also, the circuit board area devoted to memory elements is reduced.

In addition to storing program code in the SRAM 18, mismatches in the memory cells can also permit the SRAM 18 to power up with known data stored therein, obviating the need for a separate non-volatile memory to store the data. Again, the circuit board area consumed by these separate memory devices and the device initialization time are reduced.

Figure 2:
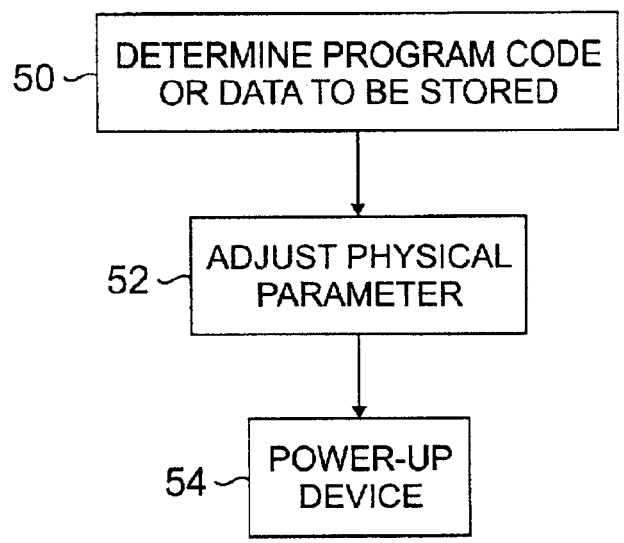
FIGS. 2 and 3 are flowcharts setting forth the steps for achieving the desired initial state of a static random access memory according to the teachings of the present invention.

FIG. 2 illustrates a flow chart for setting the initial state of the SRAM 18 according to the teachings of the present invention. At a step 50, the data or program code to be stored in the SRAM 18 at power-up is determined and individual binary bits of the code or data are assigned to memory cells within the SRAM 18. At a step 52 the threshold voltage or drive current (or another operational characteristic that influences the turn-on state) of the MOSFETs comprising the memory cells of the SRAM 18 is established according to one or more of the aforementioned techniques for adjusting a physical characteristic of the MOSFET, to produce the desired operational effect that in turn determines the turn-on state of the MOSFET. Exemplary adjustable physical characteristics include an implant adjustment or a geometrical offset as described above. Other adjustable physical characteristics that can achieve a desired turn-on state are known to those skilled in the art. Thus when the SRAM 18 powers-up the appropriate MOSFET within each memory cell turns on first, and as a result the correct bit is present in the memory cell. At a step 54 the device, including the SRAM 18, is powered-up and the SRAM 18 assumes the desired initial state values for proper operation of the device.

According to another embodiment of the invention, the physical or operational characteristics of the MOSFETs comprising the memory cell 20 are altered after fabrication of the SRAM 18. Alteration of one or more such characteristics impacts the operational characteristics to predetermine the turn-on state of the effected MOSFETs, and thus the turn-on state of the memory cell comprising the effected MOSFET.

In this embodiment, each memory cell 20, 21, 22 and 23 of the SRAM array 18 is placed into the inverse of the desired state. That is, if it is desired to store a binary "1" in a memory cell to represent a bit of executable code or start-up data, the inverse of "1", that is, a "0", is stored in the memory cell. Assume the memory cell 20 is placed in the "0" state. The MOSFETs 48 and 40 are on and the MOSFETs 42 and 46 are off. The MOSFETs are then stressed, for example, by raising the supply voltage ($V_{DD}$) above its nominal value until hot carriers are formed in the channel of the "on" MOSFETs 48 and 40. Specifically, hot carrier holes are formed in the channel of the MOSFET 48. If the supply voltage is raised to a sufficiently high level, the holes will gain enough kinetic energy to surmount the potential barrier between the channel and the gate oxide. Some of these hot holes become trapped in the gate oxide as fixed charges and raise the threshold voltage for the MOSFET 48. Since the threshold voltage for the MOSFET 48 has increased, the MOSFET 46 turns on before the MOSFET 48 at power-up. Thus after stressing the memory cells the MOSFETs are mismatched in such a way that the desired program code or data will be "loaded" into the memory array on power-up.

Hot carriers can also be created for n-channel MOSFETs (such as n-channnel MOSFETs 40 and 42). The hot carrier effect for electrons in n-channel devices is more pronounced than for holes in p-channel devices. The hole mobility is about half the mobility of electrons, hence for the same electric field created by raising $V_{DD}$, the number of hot holes is about half the number of hot electrons. Also, the potential barrier that the holes must surmount to enter the gate oxide is greater than the potential barrier for electrons. Careful selection of the supply voltage value for creating the hot carriers, both hot holes and hot electrons, results in a shift of the threshold voltage without significantly affecting the normal operation of the memory array 18.

Also as a result of the formation of hot carriers, the output current of the stressed device increases. This current increase results in an imbalance in the memory cell 20 when it is powered up and the memory cell 20 therefore goes into a predictable initial state.

To stress the MOSFETs as described above, the supply voltage may need to be increased significantly above its nominal value, three or four times the nominal value, for example. Also, the formation and impact of hot carriers on MOSFET performance can be influenced by modifying the tub bias of the MOSFET. The tub refers to the doped semiconductor well or region in which the source, drain and channel regions are formed for a CMOS inverter device. The NMOS device is formed in a p-type well and the PMOS device is formed within an n-type well. The wells are also insulated from each other.

Figure 3:
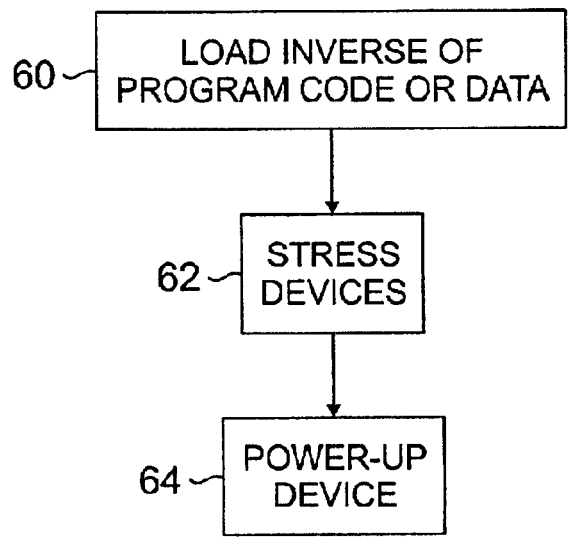

FIG. 3 is a flowchart of anther embodiment according to the teachings of the present invention, illustrating the steps for controlling the power-up state of the SRAM 18. At a step 60 the inverse of the program code or data that is to appear in memory at power-up is loaded into the SRAM 18. At a step 62 the MOSFET devices comprising the memory cells storing the program code or data are stressed as described above. When the device is later powered-up (step 64), the stressed memory cells of the SRAM 18 go to the desired initial state.

The process of stressing the SRAM 18 to predetermine the initial state of the memory cells 20, 21, 22 and 23 can also be performed after the SRAM 18 has been placed into service. Thus according to this method, the SRAM 18 can be "reprogrammed" during service. This embodiment is particularly useful when the SRAM 18 is operative with a device that is placed into service with initial state values for start-up data and executable program code, but later it is required to change the start-up data or the code. Restressing the SRAM 18 after initial service allows the device to be reprogrammed by changing the code or the start-up data.

Figure 4:
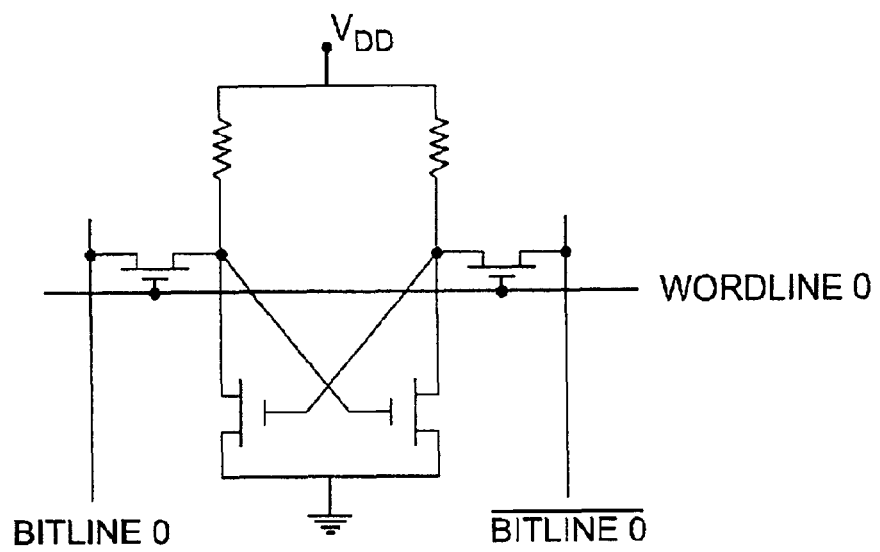
FIGS. 4 through 6 are schematic diagrams of alternative embodiments of memory cells for a static random access memory.
Figure 5:
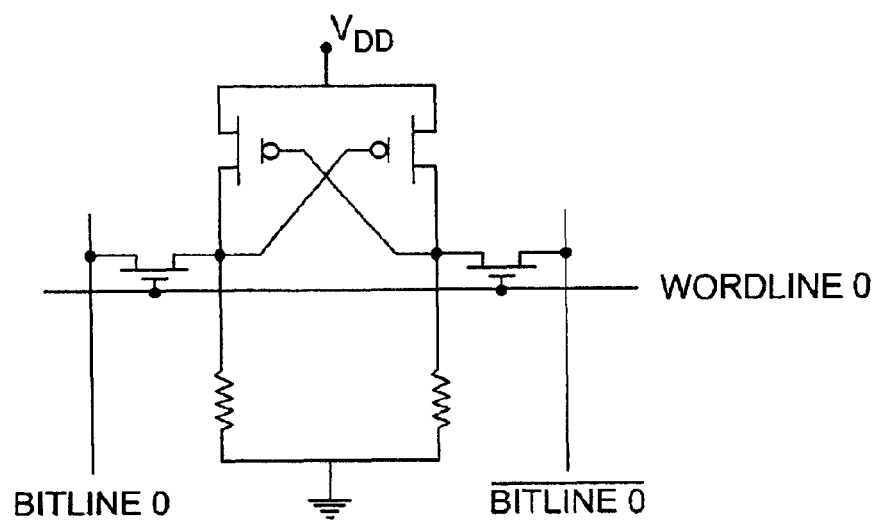
Figure 6:
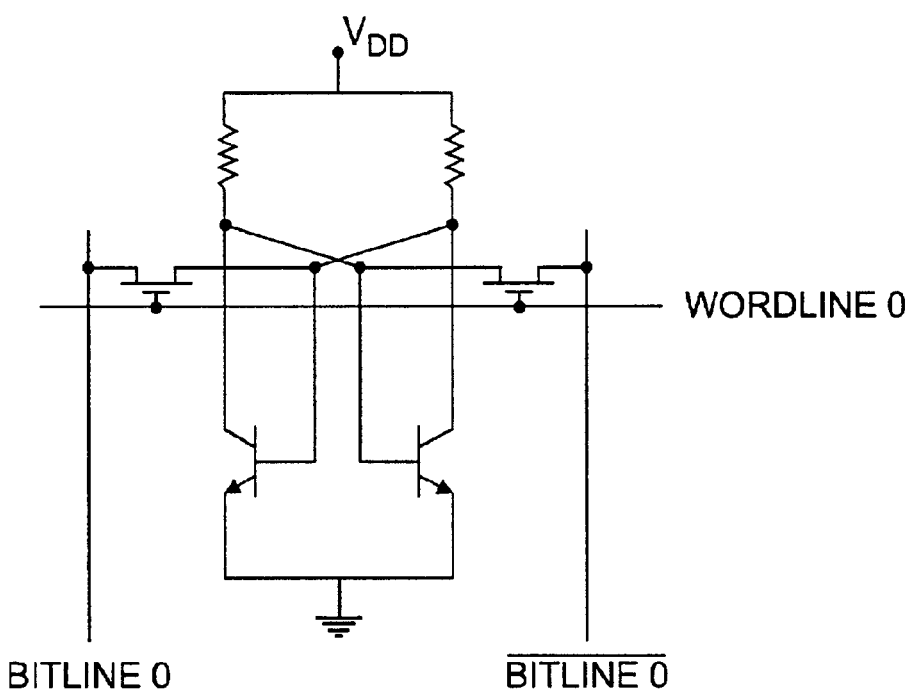

In other embodiments of the present invention, NMOS, PMOS and bipolar transistor configurations, including their associated resistors, as illustrated in FIGS. 4, 5 and 6, form the memory cells 20, 21 and 22 and 23, a plurality of which form the memory array 18. As is known to those skilled in the art, operation of these embodiments is similar to the cross-coupled CMOS embodiment described above. These devices can also be fabricated with different physical parameters or stressed to control the start-up state as described above.

While the invention has been described with reference to preferred embodiments, it will be understood by those skilled in the art that various changes may be made and equivalent elements may be substituted for elements thereof without departing from the scope of the present invention. The scope of the present invention further includes any combination of the elements from the various embodiments set forth herein. In addition, modifications may be made to adapt a particular situation to the teachings of the present invention without departing from its essential scope. Therefore, it is intended that the invention not be limited to the particular embodiment disclosed as the best mode contemplated for carrying out this invention, but that the invention will include all embodiments falling within the scope of the appended claims.

What is claimed is:

1. A method for defining the initial state of a memory cell having first and second complimentary elements, the method comprising
   identifying a parameter of the memory cell that influences the initial state;
   determining the desired initial state of the memory cell; and
   controlling the identified parameter to create parameter mismatches such that at start-up one of the complimentary elements turns on before the other to effect the desired initial state, wherein the desired initial state is a predetermined initial state.

2. The method of claim 1 wherein the initial state of the memory cell is the state of the memory cell when power is applied thereto.

3. The method of claim 1 for determining the initial state of a plurality of memory cells, wherein the plurality of memory cells comprise a static random access memory operative within a device.

4. The method of claim 3 wherein the initial state of the static random access memory comprises data for use by the device.

5. The method of claim 3 wherein the initial state of the static random access memory comprises executable program code for controlling operation of the device.

6. The method of claim 1 wherein the initial state of the memory cell comprises a zero or a one.

7. The method of claim 1 wherein the memory cell comprises a plurality of MOSFETs, and wherein the step of controlling the identified parameter comprises controlling a physical parameter of at least one of the plurality of MOSFETs.

8. The method of claim 7 wherein the physical parameter is selected from among the channel length, the channel width, the channel doping density and the trapped charges of one or more of the MOSFETs.

9. The method of claim 8 wherein the plurality of MOSFETs comprise two cross-coupled CMOS inverters, each of the CMOS inverters comprising an NMOS and a PMOS field-effect transistor.

10. The method of claim 9 wherein each of the NMOS and the PMOS transistors comprises source and drain regions separated by a channel region, and further comprises a gate electrode oriented proximate the channel region and separated therefrom by a gate oxide, and wherein the physical parameter comprises one or more of the doping level of the source and drain regions, the gate oxide capacitance, trapped charges within the gate oxide, trapped charges within the channel region, geometrical offsets between device regions, the channel length and the channel width.

11. The method of claim 9 wherein the step of controlling the identified parameter further comprises controlling the channel length of the NMOS and the PMOS transistors.

12. The method of claim 11 wherein the channel length determines the current through the NMOS and the PMOS transistors of each CMOS inverter, thereby influencing the initial state of the memory cell.

13. The method of claim 11 wherein the step of controlling the channel length further comprises defining the characteristics of the gate of the NMOS and the PMOS transistors.

14. The method of claim 11 wherein the step of controlling the channel length further comprises controlling the photo mask that defines the gate of the NMOS and the PMOS transistors.

15. The method of claim 11 wherein the step of controlling the channel length further comprises controlling the etch process used to pattern the gate of the NMOS and the PMOS transistors.

16. The method of claim 9 wherein the step of controlling the identified parameter further comprises controlling the channel width of the NMOS and the PMOS transistors.

17. The method of claim 16 wherein the channel width determines the current through the NMOS and the PMOS transistors of each CMOS inverter, thereby influencing the initial state of the memory cell.

18. The method of claim 16 wherein the step of controlling the channel width further comprises defining the characteristics of the active regions of the NMOS and the PMOS transistors.

19. The method of claim 16 wherein the step of controlling the channel width further comprises controlling the photo mask that defines the gate of the NMOS and the PMOS transistors.

20. The method of claim 16 wherein the step of controlling the channel width further comprises controlling the etch process used to pattern the gates of the NMOS and the PMOS transistors.

21. The method of claim 9 wherein the step of controlling the identified parameter further comprises controlling the channel doping density.

22. The method of claim 21 wherein the step of controlling the channel doping density further comprises performing a threshold adjust ion implantation of a dopant in the channel.

23. The method of claim 8 wherein the plurality of MOSFETs are selected from among two cross-coupled PMOS transistors, two cross-coupled NMOS transistors and two cross-coupled bipolar transistors.

24. The method of claim 1 wherein the memory cell comprises a plurality of MOSFETs, and wherein the step of controlling the identified parameter comprises controlling an operational parameter of at least one of the plurality of MOSFETs.

25. The method of claim 24 wherein the step of controlling the operational parameter further comprises stressing one or more of the plurality of MOSFETs beyond the normal operating parameters.

26. The method of claim 25 wherein the threshold voltage of at least one of the plurality of MOSFETs is determined by charges trapped in one of the plurality of MOSFETs.

27. The method of claim 25 wherein the charges trapped in one of the plurality of MOSFETs are induced by storing the inverse of the desired initial state in the memory cell and manipulating the terminal voltage applied to the memory cell.

28. The method of claim 27 wherein the step of manipulating the terminal voltage further comprises increasing the terminal voltage above the normal operating voltage.

29. The method of claim 28 wherein the step of increasing the terminal voltage above the normal operating voltage causes impact ionization to occur.

30. The method of claim 24 wherein the operational parameter further comprises the threshold voltage of at least one of the plurality of MOSFETs.

31. The method of claim 30 wherein the threshold voltage determines the turn-on point of the MOSFETs, thereby influencing the initial state of the memory cell.

32. A method for defining the initial state of a memory array comprising a plurality of memory cells, wherein each of the plurality of memory cells comprises a plurality of MOSFETs, and wherein the memory array is operative in conjunction with a device for storing program code and start-up data for execution by the device within the plurality of memory cells, the method comprising identifying a parameter of the plurality of MOSFETs that influences the initial state of the memory cell;

determining the desired initial state of the memory cell; and stressing one or more of the plurality of MOSFETs beyond normal operating parameters to affect the identified parameter such that the initial state of the memory cell is the desired initial state.

33. The method of claim 32 wherein the step of stressing the plurality of MOSFETs comprises restressing the plurality of MOSFETs to alter the program code or start-up data after the device has been placed in service.

* * * * *